United States Patent
Kojima

(10) Patent No.: US 8,599,263 B2
(45) Date of Patent: Dec. 3, 2013

(54) CAMERA MODULE AND METHOD OF MANUFACTURING THE SAME

(75) Inventor: Tominari Kojima, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 404 days.

(21) Appl. No.: 12/794,941

(22) Filed: Jun. 7, 2010

(65) Prior Publication Data

US 2010/0309316 A1    Dec. 9, 2010

(30) Foreign Application Priority Data

Jun. 8, 2009   (JP) ................................ P2009-137395

(51) Int. Cl.
    *H04N 5/33*   (2006.01)
(52) U.S. Cl.
    USPC ........................................................... 348/164
(58) Field of Classification Search
    CPC ................................ H04N 3/14;  H04N 5/225
    USPC .................. 348/294, 308, 340, 342, 374, 164
    IPC .............................................. H04N 3/14, 5/225
    See application file for complete search history.

(56) References Cited

U.S. PATENT DOCUMENTS

| | | | | |
|---|---|---|---|---|
| 7,929,033 | B2 * | 4/2011 | Lee et al. | 348/294 |
| 2005/0242274 | A1 * | 11/2005 | Webster | 250/239 |
| 2008/0246868 | A1 * | 10/2008 | Abe | 348/308 |
| 2008/0296718 | A1 * | 12/2008 | Kumata et al. | 257/434 |

FOREIGN PATENT DOCUMENTS

| | | |
|---|---|---|
| JP | 2004-200966 | 7/2004 |
| JP | 2005-6279 | 1/2005 |
| JP | 2007-181212 | 7/2007 |
| JP | 2008-258949 | 10/2008 |

* cited by examiner

*Primary Examiner* — Young Lee
*Assistant Examiner* — Francis G Geroleo
(74) *Attorney, Agent, or Firm* — Drinker Biddle & Reath LLP

(57) ABSTRACT

A camera module includes: a lens unit including a casing portion and a lens; and a substrate portion on which an image pick-up element is mounted. The camera module is assembled in combination of the lens unit and the substrate portion in an arrangement in which the lens and the image pick-up element are opposed to each other. The substrate portion includes: a first substrate including one of surfaces on which the image pick-up element is mounted; an infrared filter supported on a light receiving face of the image pick-up element; and a second substrate supported on a surface of the infrared filter which is opposed to the lens. The second substrate includes an opening portion disposed in alignment with the infrared filter so as not to intercept an incident light. A circuit component is mounted on the second substrate.

6 Claims, 6 Drawing Sheets

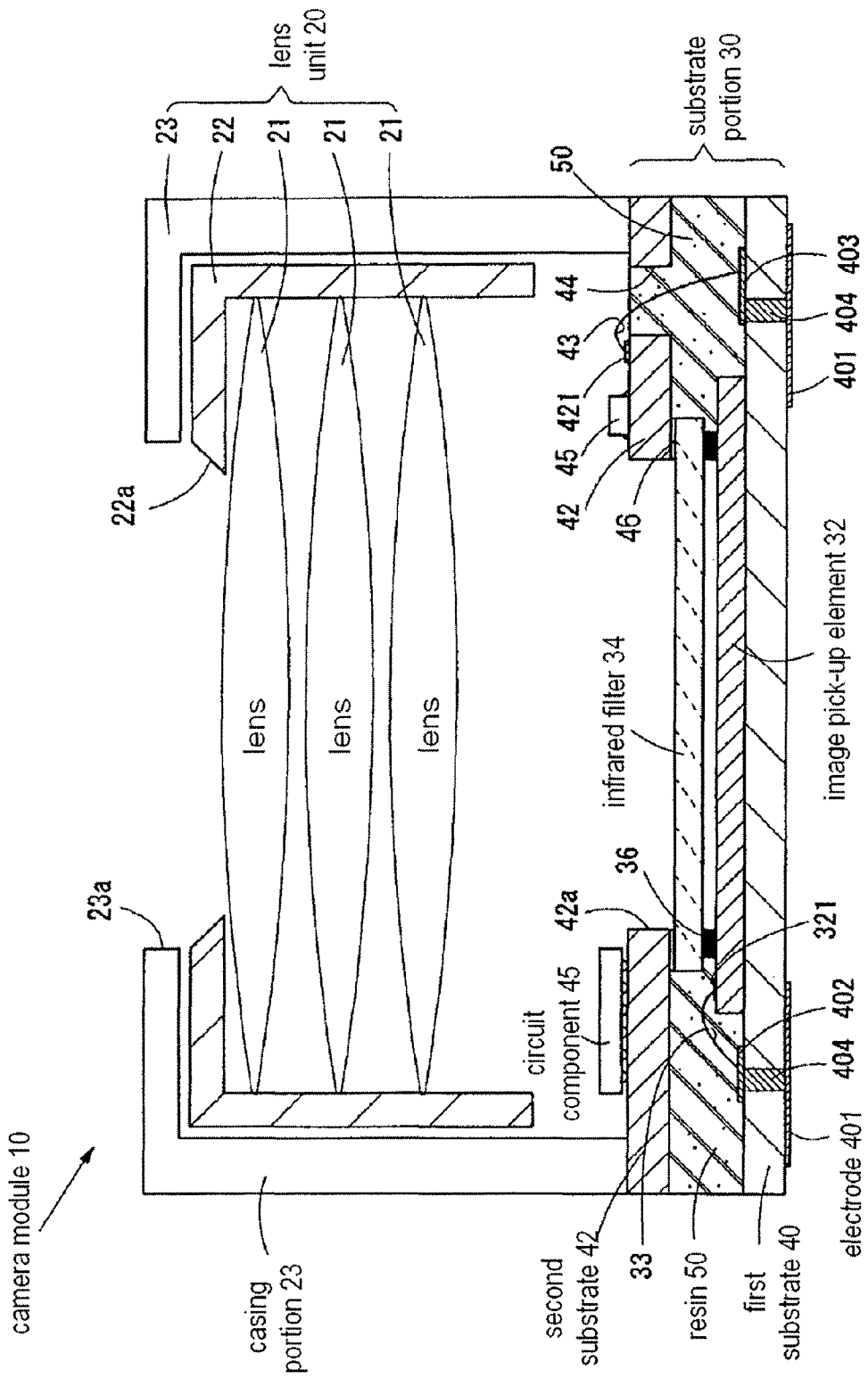

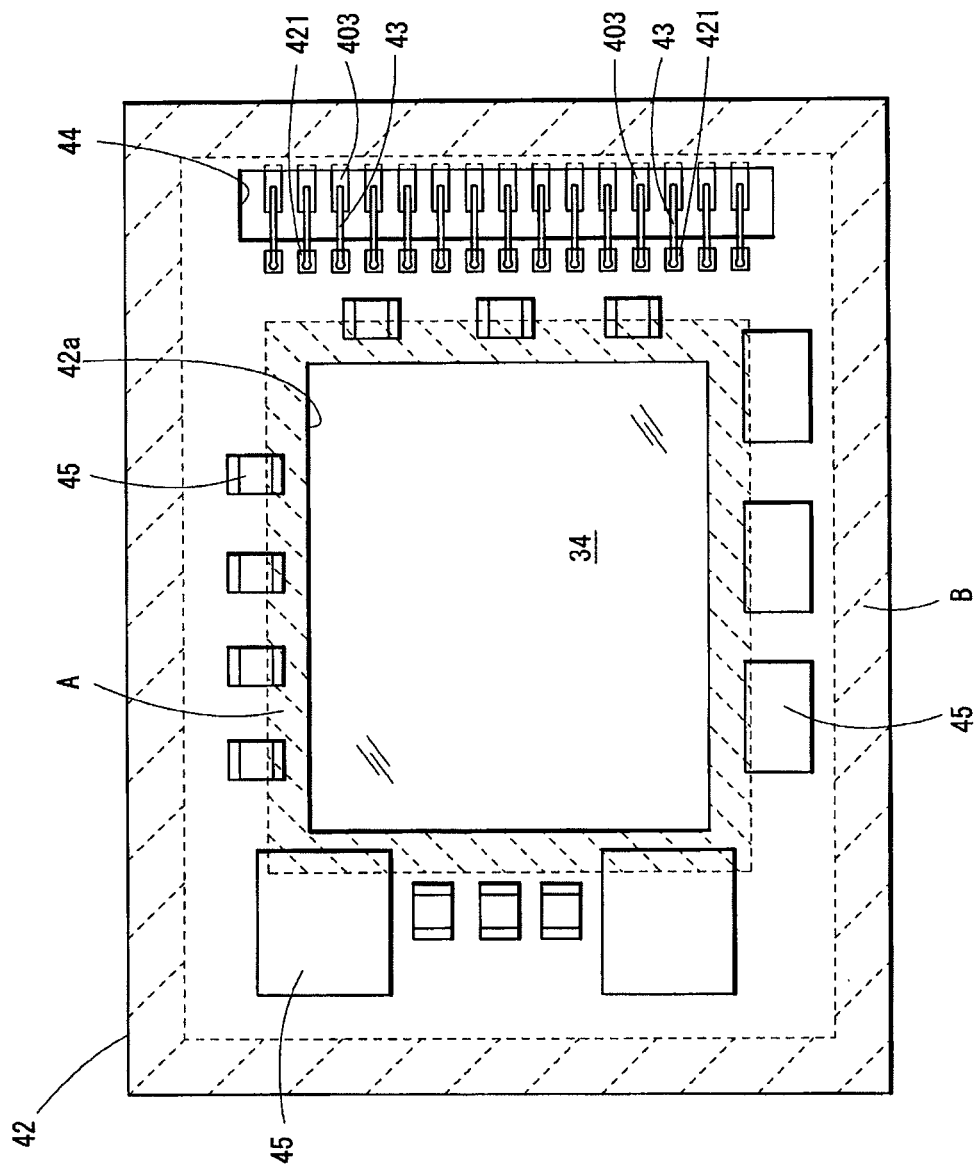

CAMERA MODULE AND METHOD OF MANUFACTURING THE SAME

This application claims priority from Japanese Patent Application No. 2009-137395, filed on Jun. 8, 2009, the entire contents of which are hereby incorporated by reference.

FIELD OF THE INVENTION

The present invention relates to a camera module serving as an image pick-up device and a method of manufacturing the camera module.

DESCRIPTION OF RELATED ART

A portable terminal machine has a large number of types of products provided with an image pick-up device. For the image pick-up device of the portable terminal machine, a small-sized camera module is used. The camera module is formed by providing, in a casing, a lens unit, an image pick-up element and a circuit component such as a chip capacitor constituting a controlling circuit.

Since a reduction in a size is required for the portable terminal machine, a decrease in a size and a thickness is also demanded for the camera module to be provided therein. For this reason, there are proposed a method of laminating and disposing a circuit component on an image pick-up element, a method of embedding and disposing a circuit component in a substrate provided with an image pick-up element and a method of forming a cavity on a substrate and providing an image pick-up element in the cavity, in place of an arrangement in which a circuit component to be disposed together with an image pick-up element is flatly provided on a substrate.

[Patent Document 1] JP-A-2005-6279 Publication
[Patent Document 2] JP-A-2007-181212 Publication When a height of a camera module is decreased with a reduction in a size of the camera module, an interval between a lens and an image pick-up element is necessarily reduced. In order to cause an image to have high picture quality (to increase the number of pixels), however, a larger interval between the lens and a sensor surface of the image pick-up element is more advantageous in respect of a design of the lens and can cause a performance to be enhanced.

With a structure of a related-art camera module, referring to a method of embedding a circuit component in a substrate provided with an image pick-up element, for example, a thickness of the substrate is increased even if a size of a plane region of the camera module can be reduced, and a reduction of a height of the whole camera module is restricted if an interval between the image pick-up element and a lens is ensured.

In a camera module of an automatic focusing type, moreover, the number of controlling circuit components is larger than that in a camera module of a fixed focusing type. In a method of providing a circuit component on an image pick-up element, therefore, a space for mounting the circuit component thereon cannot be ensured sufficiently.

SUMMARY OF INVENTION

Illustrative aspects of the present invention provide a camera module in which it is possible to reduce a size and a thickness without damaging a performance of the camera module, and a method of manufacturing the camera module.

According to a first aspect of the invention, a camera module comprising:
a lens unit including a casing portion and a lens; and
a substrate portion on which an image pick-up element is mounted,
wherein the camera module is assembled in combination of the lens unit and the substrate portion in an arrangement in which the lens and the image pick-up element are opposed to each other,
wherein the substrate portion includes:
a first substrate including one of surfaces on which the image pick-up element is mounted;
an infrared filter supported on a light receiving face of the image pick-up element; and
a second substrate supported on a surface of the infrared filter which is opposed to the lens,
wherein the second substrate includes an opening portion disposed in alignment with the infrared filter so as not to intercept an incident light, and
wherein a circuit component is mounted on the second substrate.

According to a second aspect of the invention, a method of manufacturing a camera module comprising:
bonding an image pick-up element to one of surfaces of a first substrate formed to be large-sized;
bonding an infrared filter onto a light receiving face of the image pick-up element;
wire bonding an electrode terminal exposed to a peripheral edge portion of the image pick-up element to which the infrared filter is bonded, and a first pad formed on the first substrate;
bonding a second substrate onto the infrared filter in alignment of an opening portion so as not to intercept an incident light after the wire bonding step;
wire bonding the second substrate and a second pad formed on the first substrate;
filling a resin in a region interposed between the first substrate and the second substrate over outer peripheries of the image pick-up element and the infrared filter;
cutting a large-sized substrate formed by the first substrate and the second substrate into individual pieces and forming a substrate portion to be the individual piece; and
assembling the camera module in combination of the substrate portion and a lens unit.

Other aspects and advantages of the invention will be apparent from the following description, the drawings and the claims.

BRIEF DESCRIPTION OF THE DRAWINGS

FIG. 1 is a sectional view showing a whole structure of a camera module;
FIG. 3 is a plan view showing a second substrate.

DETAILED DESCRIPTION OF EXEMPLARY EMBODIMENTS

Camera Module

Figure 2A:
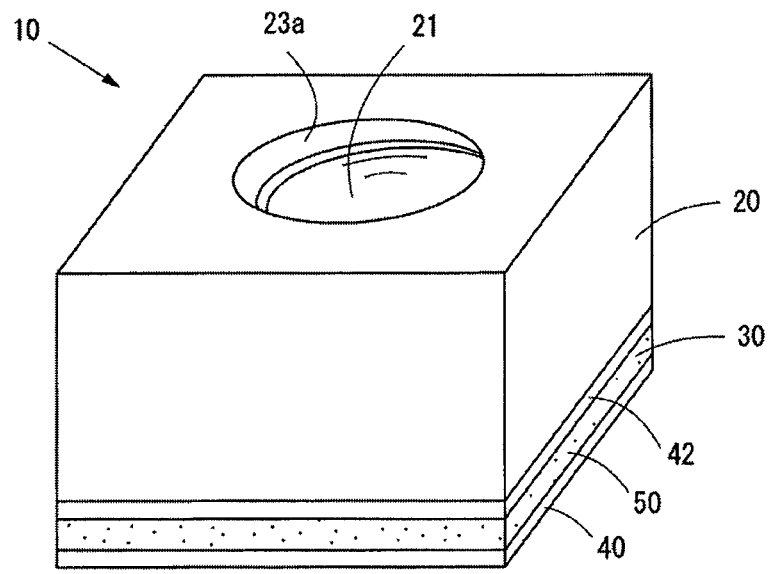
FIGS. 2A and 2B are perspective views showing the camera module.

An exemplary embodiment of a camera module according to the invention will be described below in detail with reference to FIGS. 1 to 6C.

FIG. 1 is a sectional view showing the camera module. A camera module 10 according to the exemplary embodiment includes a lens unit 20 and a substrate portion 30 to be used in combination with the lens unit 20.

The lens unit 20 includes a lens 21, a support cylinder 22 for supporting the lens 21, a casing portion 23 for supporting the support cylinder 22, and a driving portion (not shown) for moving the support cylinder 22 to a focal point. For the driving portion, a piezoelectric unit or an electric motor is used as a driving source.

The casing portion 23 is formed to take a shape of a rectangular box in which a circular opening portion 23a is formed on one end side to be a light incident side and the other end side is opened. The opening portion 23a is formed in a planar arrangement in which a center is coincident with an optical axis of the lens 21. A flange portion 22a is provided on an upper end of the support cylinder 22 with a position of an inner peripheral edge coincident with that of the opening portion 23a. The flange portion 22a serves to protect the lens 21.

In the camera module 10, the other end side of the casing portion 23 is bonded to an upper surface of the substrate portion 30 so that the lens unit 20 and the substrate portion 30 are assembled integrally.

The substrate portion 30 includes a first substrate 40 for supporting an image pick-up element 32, an infrared filter 34 for cutting infrared rays which is supported on a light receiving face of the image pick-up element 32, and a second substrate 42 bonded to a peripheral edge portion of the infrared filter 34 and supported on the infrared filter 34.

The first substrate 40 and the second substrate 42 are formed to take a planar shape which is coincident with a planar shape of an opening end face of the casing portion 23 in the lens unit 20. The first substrate 40 and the second substrate 42 are disposed apart from each other in a vertical direction through the image pick-up element 32 and the infrared filter 34. Outer peripheries of the image pick-up element 32 and the infrared filter 34 and a portion interposed between the first substrate 40 and the second substrate 42 are filled with a resin 50, and a peripheral side face of the substrate portion 30 is sealed with the resin 50.

Figure 2B:
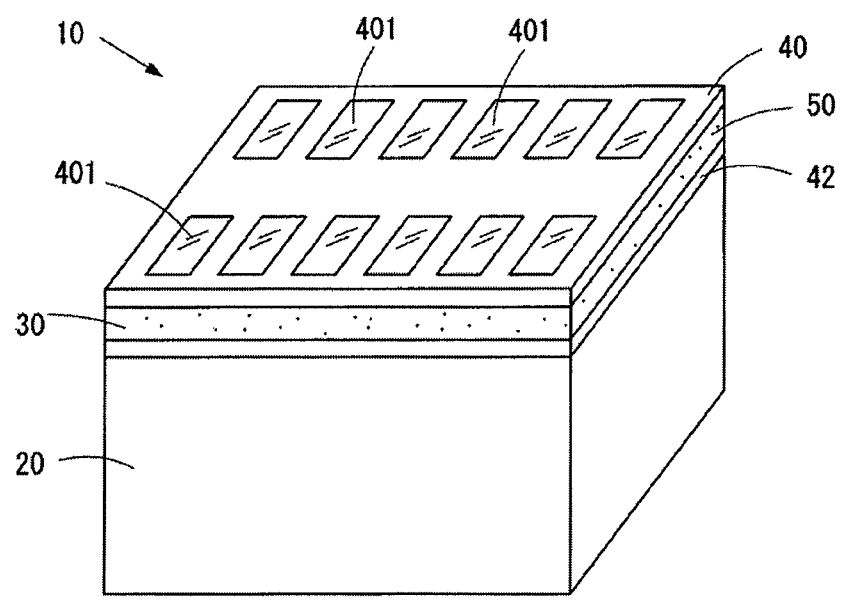

FIGS. 2A and 2B are views showing an appearance of the camera module 10. FIG. 2A shows a state in which the camera module 10 is seen from a light incident side and FIG. 2B shows a state in which the camera module 10 is seen from a mounting surface side.

The substrate portion 30 is bonded to an opening end of the casing portion 23 in the lens unit 20 to close the opening end side of the casing portion 23 so that the camera module 10 takes a whole shape of a rectangular box. The whole shape of the camera module 10 is not restricted to the shape of the rectangular box but can be formed into an optional configuration such as a cylinder or the like.

An electrode 401 to be connected to a mounting substrate is formed on the mounting surface of the camera module 10, that is, a back face of the first substrate 40. A surface of the electrode 401 is subjected to gold plating as protection plating. An operation for mounting the camera module 10 on the mounting substrate is carried out by aligning a connecting pad provided on the mounting substrate with the electrode 401 and bonding the camera module 10 to the mounting substrate through a solder reflow. The camera module 10 according to the exemplary embodiment includes twelve electrodes 401 which are arranged in two lines in which having six electrodes in one line respectively, as shown in FIG. 2B. The number and arranging position of electrode 401 are not restricted to those shown in FIG. 2B but can be formed into the arbitrary number and arranging position.

Since the camera module 10 is formed to take a shape of a single box, handling such as mounting can be carried out very easily.

In FIG. 1, a first pad 402 for bonding is provided on a surface (one of surfaces) of the first substrate 40 where the image pick-up element 32 is mounted, and a through hole portion 404 for electrically connecting the first pad 402 to the electrode 401 provided on the mounting surface (back face) of the first substrate 40 is disposed to penetrate through the first substrate 40 in the vertical direction. The image pick-up element 32 and the first pad 402 are connected to each other through a bonding wire 33.

The first substrate 40 is provided with a second pad 403 to be connected to a bonding pad 421 disposed on the second substrate 42 through wire bonding in addition to the first pad 402 to be connected to the image pick-up element 32. The second pad 403 and the electrode 401 provided on the back face of the first substrate 40 are also connected electrically to each other via the through hole portion 404 penetrating through the first substrate 40 in the vertical direction.

In the case in which the wire bonding is carried out between the second substrate 42 and the first substrate 40, a bonding wire 43 is to be extended further below a lower surface of the second substrate 42. In the exemplary embodiment, a slit hole 44 for wire bonding is provided on the second substrate 42 and the wire bonding is carried out via the slit hole 44.

The second substrate 42 is supported on the infrared filter 34 supported on the light receiving face of the image pick-up element 32.

The infrared filter 34 is bonded and supported onto the light receiving face of the image pick-up element 32 with an adhesive 36. The adhesive 36 is provided around the peripheral edge portion of the infrared filter 34, and a space between the infrared filter 34 and the light receiving face of the image pick-up element 32 is sealed (closed) from an outside in a state in which the infrared filter 34 is bonded to the image pick-up element 32.

The second substrate 42 is bonded and supported onto the peripheral edge portion of the infrared filter 34. The second substrate 42 is formed to take a shape of a frame in which a central part is opened to be a square in order to prevent a light incident on the infrared filter 34 from being intercepted. When the second substrate 42 is to be bonded to the infrared filter 34, the opening portion of the second substrate 42 and the infrared filter 34 are aligned and bonded to each other.

A circuit component 45 such as a controlling IC chip or a chip capacitor is mounted on the second substrate 42. An electrode for mounting the circuit component 45 through solder bonding or the like and a wiring pattern for electrically connecting the circuit component 45 to the pad 421 are formed on an upper surface of the second substrate 42. By wire bonding the pad 421 to the second pad 403 provided on the first substrate 40, the circuit component 45 mounted on the second substrate 42 is electrically connected to the first substrate 40.

Peripheries of the image pick-up element 32 and the infrared filter 34 and a portion interposed between the first substrate 40 and the second substrate 42 are sealed with the resin 50 so that the image pick-up element 32 and the infrared filter 34 are shielded from the outside, and the first pad 402, the second pad 403 and the bonding wires 33 and 43 are sealed. The resin 50 is filled by a potting method or a resin sealing method using a resin mold.

Figure 4:
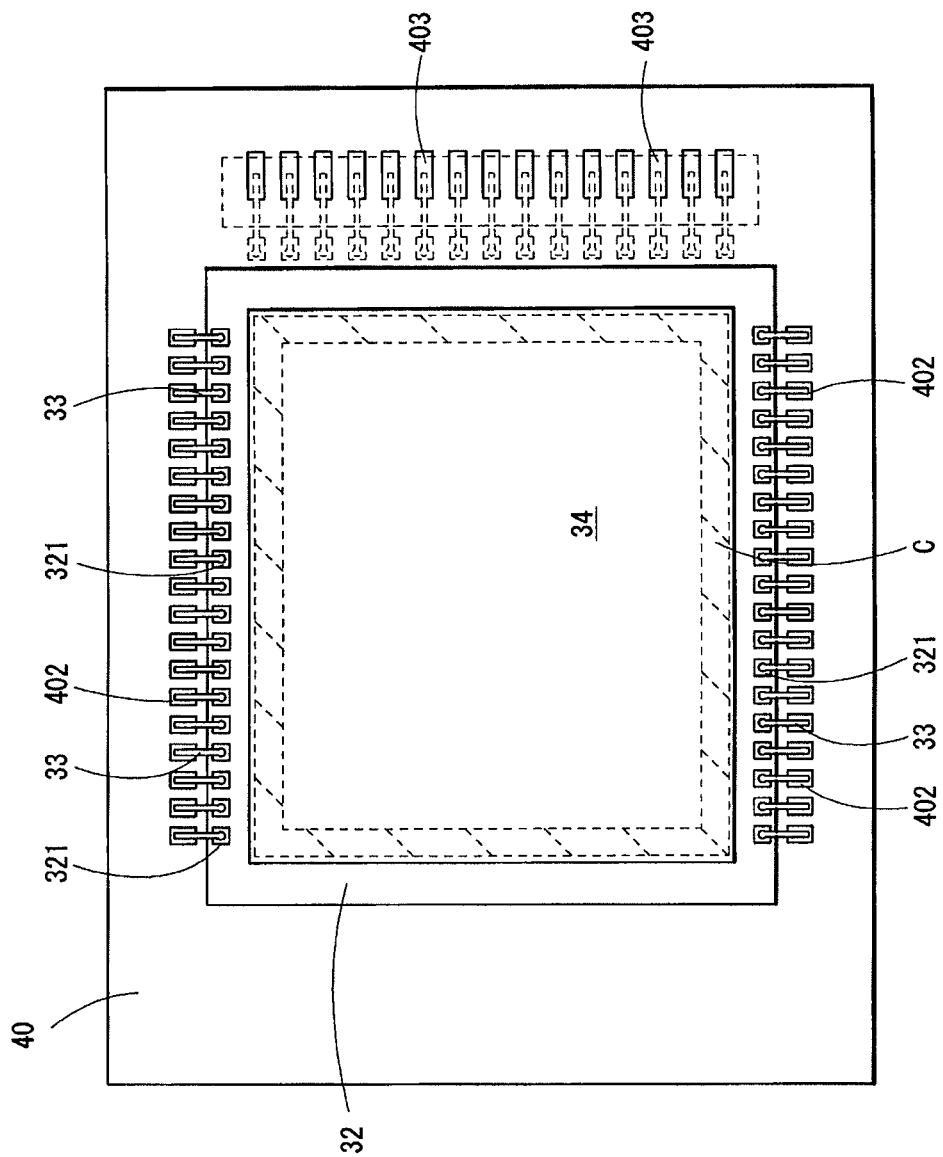
FIG. 4 is a plan view showing a first substrate.

FIGS. 3 and 4 show a planar structure of the camera module 10. FIG. 3 is a plan view showing the second substrate 42.

As described above, the second substrate 42 is formed to take an external shape which is coincident with the planar shape of the casing portion 23 in the lens unit 20 and has an opening portion 42a provided rectangularly in a central part thereof. The infrared filter 34 is exposed into the opening portion 42a.

A slant line region (an A portion) provided along the peripheral edge portion of the infrared filter 34 serves as a bonding region of the infrared filter 34 and the second substrate 42. An end face of the casing portion 23 in the lens unit 20 is bonded to a slant line region (a B portion) provided along the peripheral edge portion of the second substrate 42.

The circuit component 45 is mounted on an inside of a region to which the casing portion 23 is bonded over the upper surface of the second substrate 42. By mounting the circuit component 45 on the second substrate 42, it is possible to ensure a larger region as a mounting region for the circuit component 45 as compared with the case in which the circuit component is mounted on the upper surface of the image pick-up element 32. Accordingly, it is possible to mount the circuit component 45 with a margin also in a product having a large number of circuit components, for example, a camera module of an automatic focusing type.

The second substrate 42 is provided with the slit hole 44 for connecting the pad 421 and the second pad 403 disposed on the first substrate 40 through the wire bonding.

In the exemplary embodiment, the slit hole 44 is formed along one of sides of the second substrate 42, and the pad 421 is arranged along the slit hole 44. An arranging position of the slit hole 44 to be provided on the second substrate 42 is not particularly restricted but can be properly designed together with the arrangement of the pad 421. It is also possible to properly select an arranging position of the circuit component 45 to be mounted on the second substrate 42 and the number of the circuit components 45 to be arranged.

FIG. 4 shows a planar arrangement of the first pad 402, the second pad 403, the image pick-up element 32 and the bonding wire 33 over the first substrate 40.

As described above, the electrical connection of the image pick-up element 32 and the first substrate 40 is carried out by wire bonding an electrode terminal 321 of the image pick-up element 32 to the first pad 402. The electrode terminal 321 of the image pick-up element 32 is formed on two sides which are opposed to each other and are different from the side where the pad 421 of the second substrate 42 is disposed, and the first pad 402 and the second pad 403 are disposed on different sides from each other. When wire bonding the image pick-up element 32 and the first substrate 40, and the first substrate 40 and the second substrate 42, consequently, it is possible to carry out the wire bonding without an interference of the bonding wire.

In FIG. 4, a slant line region (a C portion) on the image pick-up element 32 is a bonding region in the case in which the infrared filter 34 is bonded to the image pick-up element 32. The image pick-up element 32 and the first pad 402 are subjected to wire bonding between the electrode terminal 321 exposed to an outer peripheral region of the bonding region and the first pad 402 when the infrared filter 34 is bonded to the image pick-up element 32.

After the image pick-up element 32 and the pad 402 are subjected to the wire bonding, the second substrate 42 is stacked and bonded onto the infrared filter 34. As shown in FIG. 1, the infrared filter 34 functions as a support for supporting the second substrate 42, and at the same time, also functions as a spacer for supporting the image pick-up element 32 and the second substrate 42 apart from each other. The infrared filter 34 has a thickness of approximately 150 to 300 µm. In addition to a thickness of the adhesive 36, therefore, it is possible to support the second substrate 42 sufficiently apart from the bonding wire 33 in such a manner that the bonding wire 33 can be prevented from interfering with the second substrate 42.

It is possible to optionally arrange the first pad 402 and the second pad 403 which are formed on the first substrate 40. Differently from the exemplary embodiment, the positions in which the first pad 402 and the second pad 403 are disposed are not set to be the different side positions but it is also possible to arrange the first pad 402 and the second pad 403 on the same side in two lines in order to obtain an arrangement in which the bonding wire does not interfere.

(Method of Manufacturing Camera Module)

FIGS. 5A to 6C show a process for manufacturing the camera module 10 illustrated in FIG. 1.

Figure 5A:
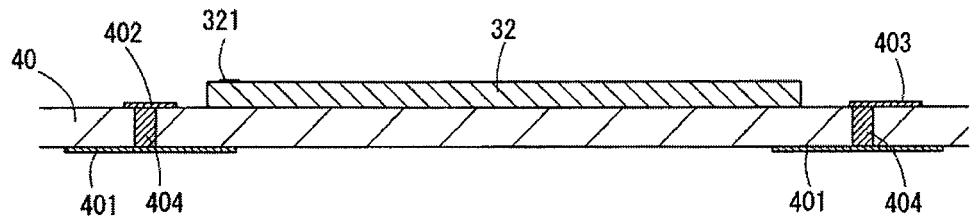
FIGS. 5A to 5D are explanatory views showing a process for manufacturing the camera module.

FIG. 5A shows a state in which the image pick-up element 32 is bonded to one of the surfaces of the first substrate 40 (a surface on an opposite side to the surface on which the electrode 401 is formed) (an image pick-up element bonding step). For explanation, FIG. 5A shows a state in which the image pick-up element 32 is mounted on a single first substrate 40. In an actual manufacturing process, a substrate formed to be large-sized is used as the first substrate 40, and the image pick-up element 32 is mounted every region serving as the substrate portion 30 to be an individual piece finally. The image pick-up element 32 is bonded to the first substrate 40 with an adhesive.

In the large-sized first substrate 40, the electrode 401 is formed on the mounting surface, the first pad 402 and the second pad 403 are formed on the surface on which the image pick-up element 32 is to be mounted, and the through hole portion 404 for electrically connecting the electrode 401 and the first pad 402, and the electrode 401 and the second pad 403 respectively is formed. A method of forming the first substrate 40 is the same as a general method of manufacturing a wiring board using a resin substrate.

Figure 5B:
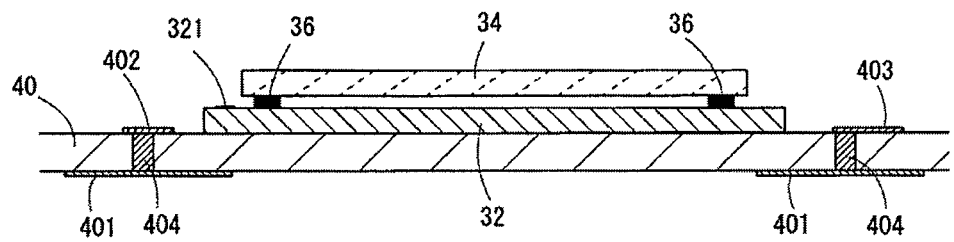

Next, the infrared filter 34 is bonded onto the light receiving face of the image pick-up element 32 (FIG. 5B). The infrared filter 34 to which an adhesive film formed like a frame is stuck is pressed and bonded onto the light receiving face of the image pick-up element 32 along the outer peripheral edge portion (an infrared filter bonding step). The infrared filter 34 can also be bonded by using a liquid adhesive in place of the adhesive film. The image pick-up element 32 is mounted in a given array on the first substrate 40 formed to be large-sized. For this reason, the infrared filter 34 is bonded onto each image pick-up element 32 in alignment therewith.

The infrared filter 34 is bonded onto the light receiving face of the image pick-up element 32 so that the light receiving face of the image pick-up element 32 is closed from the outside. Thus, dust can be prevented from entering the light receiving face of the image pick-up element 32.

Figure 5C:
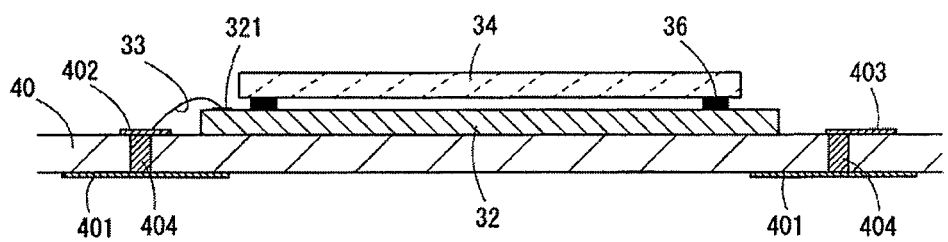

In a state in which the infrared filter 34 is bonded to the image pick-up element 32, the electrode terminal 321 is exposed from the peripheral edge portion of the upper surface of the image pick-up element 32. In this state, the electrode terminal 321 and the first pad 402 are subjected to wire bonding (an image pick-up element wire bonding step). FIG. 5C shows a state in which the electrode terminal 321 and the first pad 402 are subjected to the wire bonding. FIG. 4 corresponds to a state obtained by seeing the state of FIG. 5C in a planar direction.

As a method of electrically connecting the image pick-up element 32 to the first pad 402, it is also possible to employ a method of connecting the electrode terminal 321 of the image pick-up element 32 to the first pad 402 by using a flexible wiring board, for example, in addition to the wire bonding.

Figure 5D:
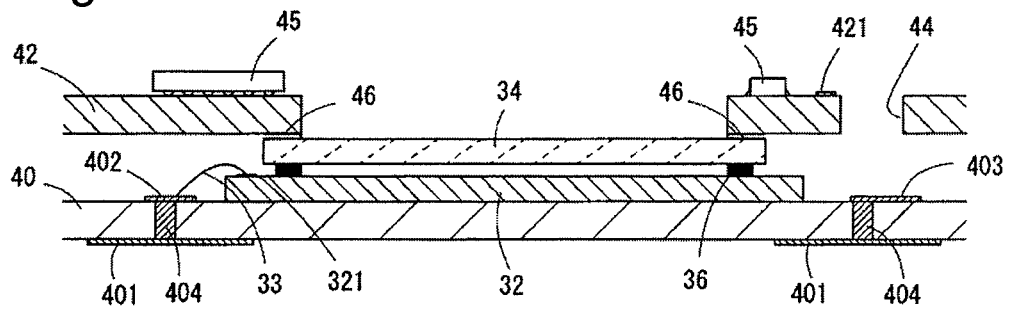

Subsequently, the second substrate 42 is bonded to the upper surface of the infrared filter 34 with an adhesive 46 (FIG. 5D). The second substrate 42 may be formed to be a large-sized substrate in the same manner as the first substrate 40 and may be bonded to the first substrate 40 in alignment therewith or the second substrate 42 may be formed to be an individual piece and may be bonded to each infrared filter 34 in alignment therewith. The second substrate 42 to be used is previously provided with the circuit component 45 such as a controlling IC or a chip capacitor.

Figure 6A:
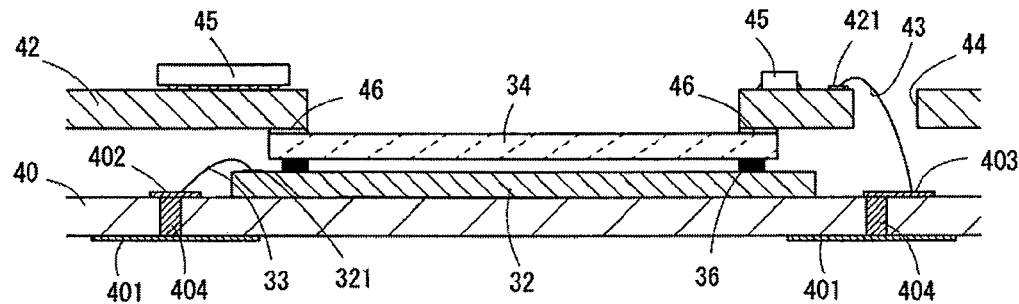
FIGS. 6A to 6C are explanatory views showing the process for manufacturing the camera module.

FIG. 6A shows a state in which the pad 421 formed on the second substrate 42 and the second pad 403 formed on the first substrate 40 are subjected to wire bonding (a step of connecting the second substrate and the first substrate through wire bonding). The pad 421 of the second substrate 42 and the second pad 403 are subjected to the wire bonding via the slit hole 44 provided on the second substrate 42. FIG. 3 corresponds to a state obtained by seeing the state of FIG. 6A in a planar direction.

Figure 6B:
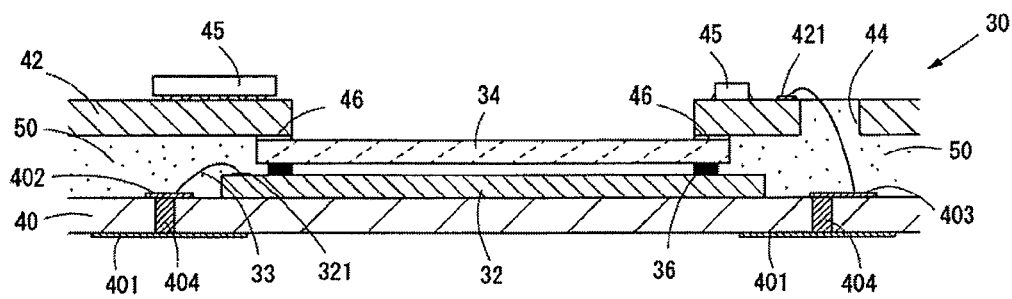

Then, the resin 50 is filled in the portion interposed between the first substrate 40 and the second substrate 42 over the outer peripheries of the image pick-up element 32 and the infrared filter 34 (a resin filling step). The slit hole 44 is formed for the wire bonding on the second substrate 42. Also in the case in which the large-sized second substrate 42 is used, therefore, the resin 50 is injected through the slit hole 44 so that the resin 50 can be filled in a clearance portion between the first substrate 40 and the second substrate 42. FIG. 6B shows a state in which the resin 50 is filled between the first substrate 40 and the second substrate 42.

Since the infrared filter 34 is bonded to the light receiving face of the image pick-up element 32, the resin 50 can be prevented from entering a gap between the image pick-up element 32 and the infrared filter 34. A thermosetting epoxy resin is used as the resin 50, for example.

The resin 50 is filled between the first substrate 40 and the second substrate 42 and is cured, and the large-sized workpiece is then divided into individual pieces so that the substrate portion 30 taking a shape of the individual piece is obtained (a step of forming an individual piece). Since the resin 50 is filled in the clearance portion between the first substrate 40 and the second substrate 42, the workpiece is obtained as a plate-shaped member formed integrally. Consequently, the substrate portion 30 can easily be obtained by a cutting method using a rotating blade.

The lens unit 20 is bonded to the substrate portion 30 so that the camera module 10 shown in FIG. 1 is obtained (a camera module assembling step). The lens unit 20 is assembled in a separate step. The lens unit 20 is attached in alignment with the surface on the opposite side to the surface (the mounting surface) of the substrate portion 30 where the electrode 401 is formed.

In the substrate portion 30, the image pick-up element 32 is completely sealed with the resin 50 from the infrared filter 34. Therefore, cleaning for the substrate portion 30 can easily be carried out. When the lens unit 20 is to be attached to the substrate portion 30, the substrate portion 30 is previously cleaned and attached with the circuit component 45 included therein. Consequently, it is possible to prevent a failure that dust sticks to an image pick-up portion after the assembly of the camera module 10. Thus, it is possible to enhance a manufacturing yield.

Figure 6C:
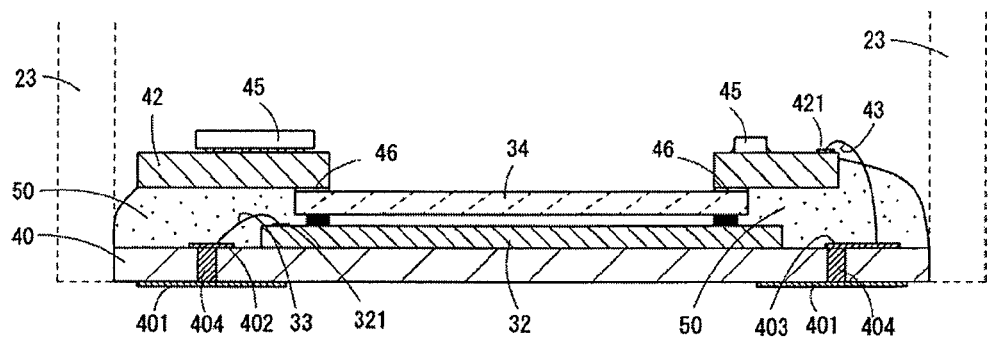

FIG. 6C shows an example in which the second substrate 42 formed like the individual piece is used. In this case, the second substrate 42 is aligned and bonded for each infrared filter 34 disposed on the first substrate 40, and the second substrate 42 and the first substrate 40 are then subjected to wire bonding. Thereafter, the resin 50 is potted to seal the outer peripheral edge portions of the first substrate 40 and the second substrate 42.

The second substrate 42 is formed like the individual piece. For this reason, the second substrate 42 and the first substrate 40 are subjected to the wire bonding beyond the outer peripheral edge of the second substrate 42 without the slit hole provided. In this case, it is also possible to connect the pad 421 of the second substrate 42 to the second pad 403 by using a flexible wiring board.

FIG. 6C shows a state in which the second substrate 42 and the first substrate 40 are subjected to the wire bonding and are then sealed with the resin 50. When the camera module is to be assembled by using the substrate portion shown in FIG. 6C, it is preferable to insert the substrate portion in the casing portion 23 of the lens unit 20 and to bond the substrate portion to the casing portion 23.

In the camera module according to the invention, the second substrate 42 for mounting the circuit component 45 thereon is provided separately from the first substrate 40 for mounting the image pick-up element 32 thereon, and the second substrate 42 is disposed in an intermediate position between the image pick-up element 32 and the lens unit 20 at the same surface side as the surface of the first substrate 40 on which the image pick-up element 32 is mounted. Consequently, the position in which the second substrate 42 for mounting the circuit component 45 thereon is disposed does not influence the whole height of the camera module 10. Thus, it is possible to design the lens unit 20 based on a relative position with the image pick-up element 32 mounted on the first substrate 40, thereby enhancing picture quality and designing the whole height of the camera module 10 to be reduced.

It is preferable that the second substrate 42 should be disposed on a condition that a light incident via the lens 21 is not intercepted. Consequently, it is possible to ensure a sufficient area for mounting the circuit component 45, and the invention can suitably be utilized for a product having a large number of circuit components to be mounted as in a camera module of an automatic focusing type. Moreover, a size can be reduced corresponding to a decrease in a height of the camera module. The invention can also be applied to a camera module of a fixed focusing type in addition to the camera module of the automatic focusing type.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A camera module comprising:
    a lens unit including a casing portion and a lens; and
    a substrate portion on which an image pick-up element is mounted,
    wherein the camera module is assembled in combination of the lens unit and the substrate portion in an arrangement in which the lens and the image pick-up element are opposed to each other,
    wherein the substrate portion includes: a first substrate made of a resin; the image pick-up element mounted on the first substrate; an infrared filter supported on a light receiving face of the image pick-up element via a frame-shaped adhesive, a space between the infrared filter and the light receiving face of the image pick-up element being sealed by the frame-shaped adhesive; and a second substrate made of a resin supported on a surface of the infrared filter which is opposed to the lens, wherein the second substrate includes an opening portion extending entirely through a thickness of the second substrate and disposed in alignment with the infrared filter so as not to intercept an incident light, wherein a circuit component is mounted on the second substrate, wherein a resin is filled between the second substrate and the first substrate up to outer peripheries of the infrared filter, the frame-shaped adhesive and the image pick-up element;

wherein the first substrate includes first pads and second pads, the first pads are connected to pads of the image pick-up element, and the second pads are connected to pads of the second substrate, wherein the infrared filter is provided on the image pick-up element within a region surrounded by the pads of the image pick-up element, as viewed from above, wherein the pads of the image pick-up element and the first pads of the first substrate are connected by bonding wires, and the resin covers the bonding wires and the pads of the image pick-up element, wherein the second substrate is bonded to the infrared filter via another adhesive which is provided around the peripheral edge portion of the infrared filter, and wherein the lens unit is provided above the second substrate, and the circuit component is mounted on the second substrate within a region surrounded by a contact portion between the lens unit and the second substrate.

2. The camera module according to claim 1, wherein an electrode to be connected to a mounting substrate is provided on a mounting surface of the first substrate, wherein a first pad and a second pad disposed on a surface which is opposite to the mounting surface of the first substrate are electrically connected to the electrode via a through hole portion provided on the first substrate, wherein the first pad and the image pick-up element are electrically connected to each other, and wherein the second pad and the second substrate are electrically connected to each other.

3. The camera module according to claim 2, wherein the first pad and the image pick-up element are subjected to wire bonding, and wherein the second pad and the second substrate are subjected to the wire bonding.

4. The camera module according to claim 3, wherein a slit hole is provided on the second substrate, and the second substrate and the first substrate are subjected to the wire bonding via the slit hole.

5. A method of manufacturing a camera module comprising:

bonding an image pick-up element to one of surfaces of a first substrate made of a resin and formed to be large-sized;

bonding an infrared filter onto a light receiving face of the image pick-up element; wire bonding an electrode terminal exposed to a peripheral edge portion of the image pick-up element to which the infrared filter is bonded, and a first pad formed on the first substrate;

bonding a second substrate made of a resin onto the infrared filter in alignment of an opening portion extending entirely through a thickness of the second substrate so as not to intercept an incident light after the wire bonding step;

wire bonding the second substrate and a second pad formed on the first substrate;

filling a resin in a region interposed between the first substrate and the second substrate over outer peripheries of the image pick-up element and the infrared filter;

cutting a large-sized substrate formed by the first substrate and the second substrate into individual pieces and forming a substrate portion to be the individual piece; assembling the camera module including bonding the substrate portion to a lens unit;

wherein the electrode terminal of the image pickup element comprises a plurality of electrode terminals, the first pad of the first substrate comprises a plurality of first pads, and the second pad of the first substrate comprises a plurality of second pads, the method further comprising:

wire bonding the first pads to the electrode terminals of the image pick-up element;

connecting the second pads to pads of the second substrate;

providing the infrared filter on the image pick-up element within a region surrounded by the electrode terminals of the image pick-up element, as viewed from above;

covering the bonding wires and the electrode terminals of the image pick-up element with the resin;

bonding the second substrate to the infrared filter via another adhesive which is provided around the peripheral edge portion of the infrared filter; and providing a lens unit above the second substrate, and mounting a circuit component on the second substrate within a region surrounded by a contact portion between the lens unit and the second substrate.

6. The method of manufacturing the camera module according to claim 5, wherein, in the first substrate, an electrode to be connected to a mounting substrate is formed on a mounting surface of the first substrate, the first pad and the second pad are formed on a surface which is opposite to the mounting surface, and a through hole portion for electrically connecting the electrode to the first pad is formed.

* * * * *